(12) United States Patent
Berman et al.

(10) Patent No.: US 6,743,701 B1
(45) Date of Patent: Jun. 1, 2004

(54) METHOD FOR THE FORMATION OF ACTIVE AREA UTILIZING REVERSE TRENCH ISOLATION

(75) Inventors: Michael J. Berman, West Linn, OR (US); Steven E. Reder, Boring, OR (US); Derryl Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/324,698

(22) Filed: Dec. 20, 2002

(51) Int. Cl.⁷ .......................... H01L 21/20; H01L 21/36
(52) U.S. Cl. ........................ 438/491; 438/413
(58) Field of Search ................. 438/400, 404, 438/413, 478, 488, 489, 490, 491

(56) References Cited

U.S. PATENT DOCUMENTS

| | | | |
|---|---|---|---|
| 4,566,914 A | * | 1/1986 | Hall ............................ 438/294 |
| 4,929,566 A | * | 5/1990 | Beitman ...................... 438/407 |
| 5,273,930 A | | 12/1993 | Steele et al. |
| 5,554,562 A | * | 9/1996 | Chang et al. ............... 438/400 |
| 5,950,097 A | * | 9/1999 | Chang et al. ............... 438/506 |
| 6,506,661 B1 | * | 1/2003 | Chang et al. ............... 438/413 |
| 6,509,242 B2 | | 1/2003 | Frei et al. |
| 6,562,736 B2 | | 5/2003 | Yanagawa et al. |
| 6,617,226 B1 | * | 9/2003 | Suguro et al. .............. 438/481 |

* cited by examiner

Primary Examiner—Richard Elms
Assistant Examiner—Beth E. Owens
(74) Attorney, Agent, or Firm—Trexler, Bushnell, Giangiorgi & Blackstone, LTD

(57) ABSTRACT

A method for forming an active area in a substrate includes the steps of growing an isolation oxide on a silicon substrate, providing a photoresist mask to define the active areas on the substrate, performing etching and stripping processes, removing the residual oxide from the active areas and selectively growing an epitaxial silicon layer.

15 Claims, 6 Drawing Sheets

METHOD FOR THE FORMATION OF ACTIVE AREA UTILIZING REVERSE TRENCH ISOLATION

BACKGROUND

The present invention generally relates to a method of isolating transistor areas. Currently, transistor areas are isolated using shallow trench isolation (STI) methods. STI methods, which are used in the beginning of the integrated circuit wafer fabrication process, have become complicated and expensive.

In addition to the complicated and expensive fabrication processes, the signal delay in current transistor architecture is due to coupling the source-drain region to the silicon substrate. Also, the dynamic portion of the ever-increasing power consumption of logic designs is directly dependent upon the source-drain coupling capacitance. The silicon on insulator process (SOI) is being investigated as a solution to the delay and power consumption issue. However, SOI adds additional expense and complication to the process and design. Some problems experienced with SOI include differential biasing of the junctions, self heating of the junctions, additional contact to the source-drain areas and ESD protection for the design.

A currently used method, based on STI process, of completing the steps to isolate one active area from another area is shown in FIGS. 1a–1g. The process begins as shown in FIG. 1 by providing a silicon wafer 10 with an initial oxide layer 12, and a nitride layer 14. Next, as shown in FIG. 1b a resist layer 16 with a masked opening 18 is provided on the nitride layer 14. As shown in FIG. 1c, an etching process is then used to cut through the nitride layer 14 and the oxide layer 12 to form a trench 20 in the wafer 10. The resist layer 16 is then removed and the resultant wafer 22 is shown in FIG. 1d.

An oxide layer 24 is then deposited over the resultant wafer 22 to fill the trench 20 as shown in FIG. 1e. Next a chemical mechanical polishing (CMP) step is performed to remove the excess oxide layer 24. FIG. 1f shows the wafer after a CMP step has been performed with a resultant dishing 26 in the oxide island 24 that filled trench 20. The final oxide island 28 is shown in FIG. 1g. As shown in FIG. 1g the initial oxide layer 12 and the nitride layer 14 have been removed. The wafer 10 includes bare silicon or active areas 30.

Other methods of isolating active areas include older methods such as, for example, LOCOS or diode junctions. Generally speaking, STI is used today because the LOCOS process is incapable of oxidizing the exposed silicon in small areas at the same rate as in large areas. This produces variations in the resultant well resistance. The STI process, however, includes many steps, is costly and it prone to process problems. For example, often problems are experienced with controlling the angle of the etched side walls as the pattern density changes across the die resulting in variations in the size of the transistors. Likewise, the oxide removal rate changes relating to the pattern density leaving behind unwanted topography. In addition, as the process geometries shrink, the aspect ratio increases causing problems with trench filling using the HDP method.

OBJECTS AND SUMMARY

A general object of an embodiment of the present invention is to provide a method for forming an active area in a wafer by utilizing reverse trench isolation.

Another object of an embodiment of the present invention is to provide a method for forming an active area in a wafer with smaller geometries.

Yet another object of an embodiment of the present invention is to provide a less expensive method for forming an active area in a wafer.

Yet another object of an embodiment of the present invention is to provide a less complicated method for forming an active area in a wafer.

A further object of an embodiment of the present invention is to provide a method for forming an active area in a wafer.

A further object of an embodiment of the present invention is to provide a method for forming active areas in a wafer, wherein the small tightly packed transistor regions can be formed.

Another object of an embodiment of the present invention is to reduce the interconnect coupling capacitance for passive devices or interconnect lines due to the lack of use of dummy islands for STI CMP planarization control.

Briefly, and in accordance with at least one of the forgoing objects, an embodiment of the present invention provides a method for forming active areas on a wafer which is less expensive and more robust relative to the currently used standard industry processes.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1A:
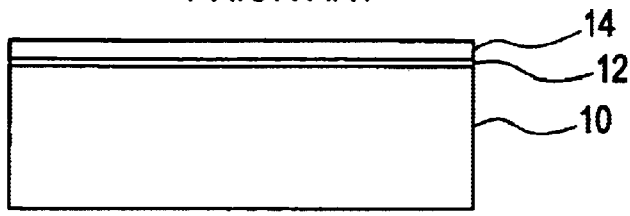
FIGS. 1a–1g show a process of forming active regions on a substrate in accordance with a prior art method.
Figure 1B:
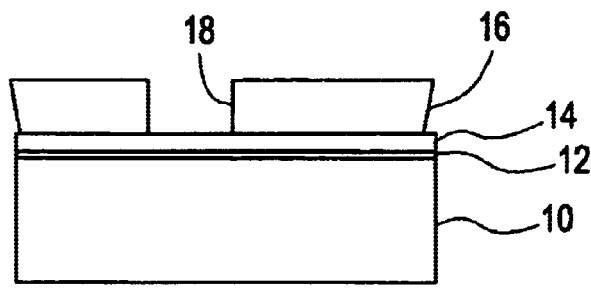
Figure 1C:
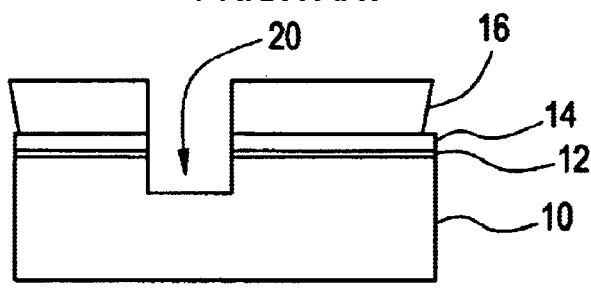
Figure 1D:
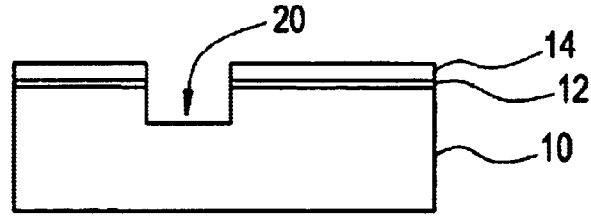
Figure 1E:
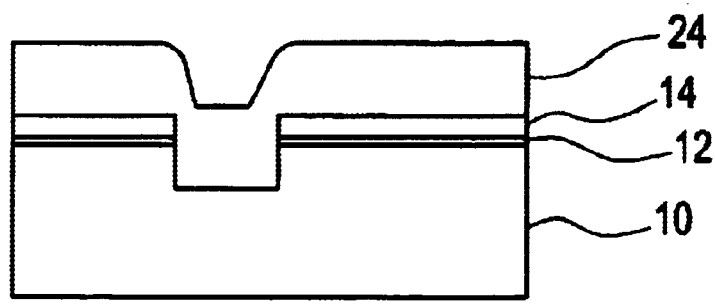
Figure 1F:
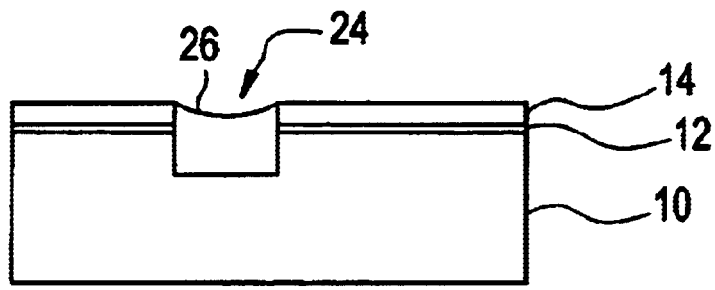
Figure 1G:
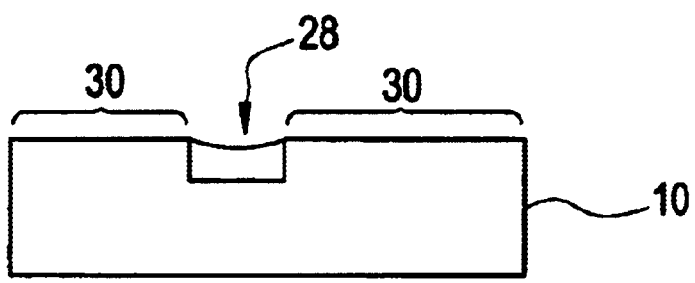

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2A:
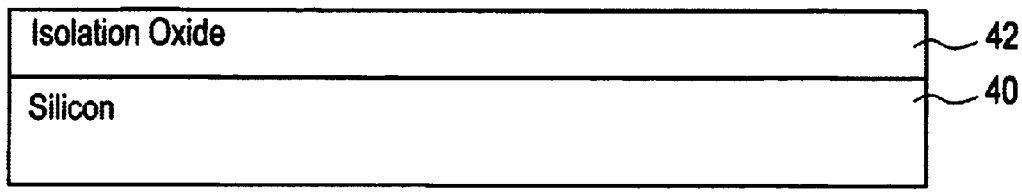
FIGS. 2a–2g show a process of forming active regions on a substrate in accordance with an embodiment of the method of the present invention.

An embodiment of the process of the present invention is shown in FIGS. 2a–2g. The process begins by providing a silicon wafer 40. After pre-cleaning the silicon wafer 40 an isolation oxide layer 42 is grown using any one of a known variety of materials as shown in FIG. 2a. This step is represented by box 100 in FIG. 3. The isolation oxide layer 42 will become the isolation region between active areas as will be described herein.

Figure 2B:
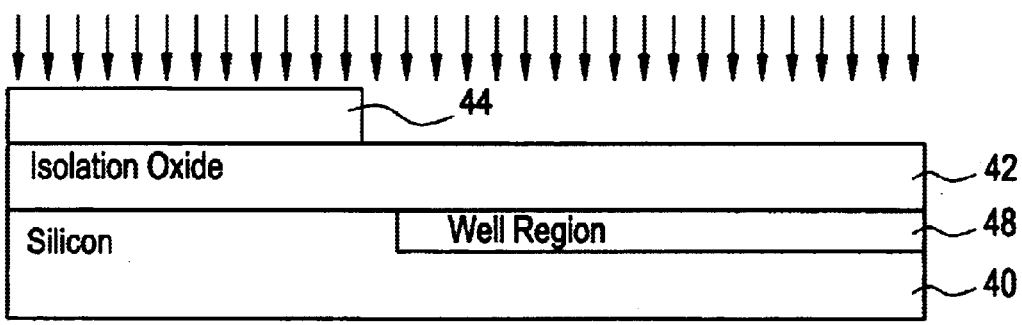
Figure 3:
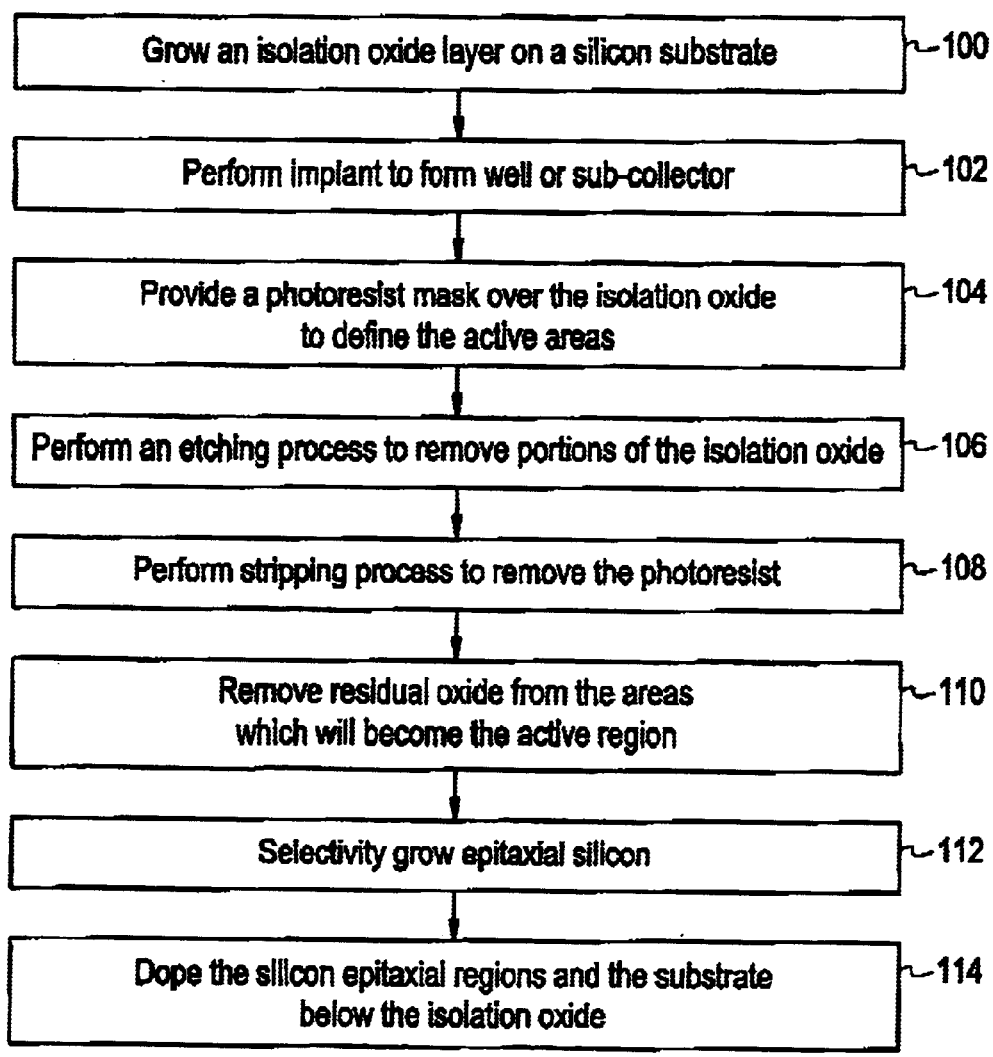
FIG. 3 is a schematic diagram of the process in accordance with an embodiment of the present invention.

Implants maybe used to form wells or sub-collector regions as shown in FIG. 2b. This step is represented by box 102 in FIG. 3. A masking layer 44 is provided over the isolation oxide layer 42. A well or sub-collector implant, represented by the arrows 46, is performed to form the well region 48. For the explanation of this embodiment, not all steps are shown for the formation of well region 48.

Figure 2C:
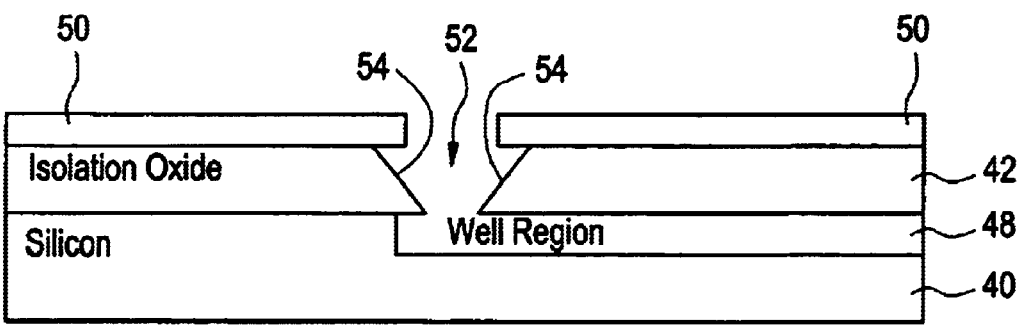
Figure 2D:
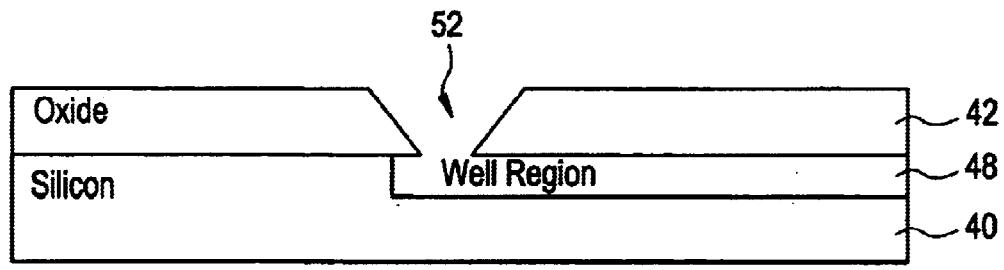

Next, as shown in FIG. 2c, a photo resist (masking) layer 50 is provided over the isolation oxide layer 42 to mask the portion of the oxide layer 42 which will become the isolation region. This step is represented by box 104 in FIG. 3. Using a high-pressure plasma etch (or alternatively a wet oxide etch) a portion of the isolation oxide layer 42 is removed, creating an opening 52 in the oxide layer 42. This step is represented by box 106 in FIG. 3. The opening 52 includes an angled side wall 54. This shape is for descriptive purposes only and the specific side wall angle and slope can have many different shapes or angles depending on the specific process. The plasma etch (or the wet oxide etch) results in a process where the lateral and vertical etch rate of the oxide layer 42 can be controlled to form the angled opening 52. The side wall 54 is angled such that the diameter of the opening 52 is smaller at the surface of the isolation oxide layer 42 which is proximate the silicon layer 40 than the diameter of the opening 52 at the surface of the isolation oxide layer 42 proximate the photoresist layer 50. A stripping process is then used to remove the photoresist layer 50 as shown in FIG. 2d. This step is represented by box 108 in FIG. 3. If well implants are to be provided, the photoresist, etching and stripping steps 104, 106, 108 may be repeated to form n and p doped regions.

Figure 2E:
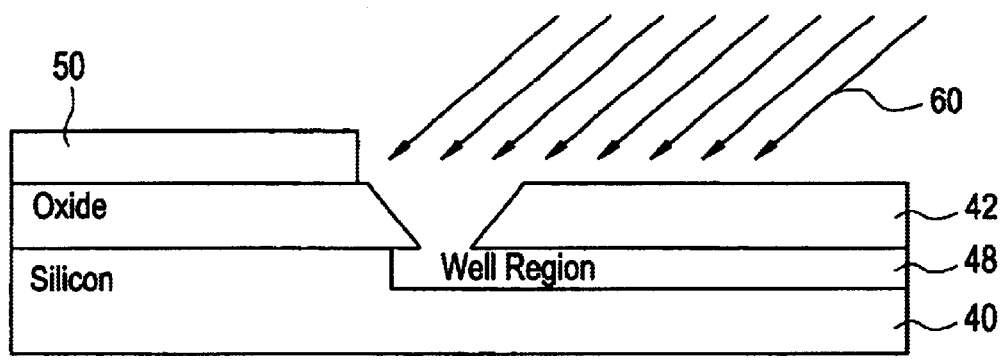

Next, the silicon epitaxial layer is grown. This step begins by cleaning the surface of the silicon wafer to remove residual oxide from the areas that will become the active areas. This step is represented by box 110 in FIG. 3. An epitaxial silicon layer is then selectively grown. This step is represented by box 112 in FIG. 3. The epitaxial silicon layer is grown only on the exposed bare silicon region. If desired, the epitaxial silicon layer may be in-situ doped to form an n or p active region. This step is represented by box 114 in FIG. 3. As shown in FIG. 2e, after the active regions have been formed, high angle well implants, represented by the arrows 60, will be used to dope the silicon epitaxial regions and the substrate 40 below the isolation oxide layer 42.

Figure 2F:
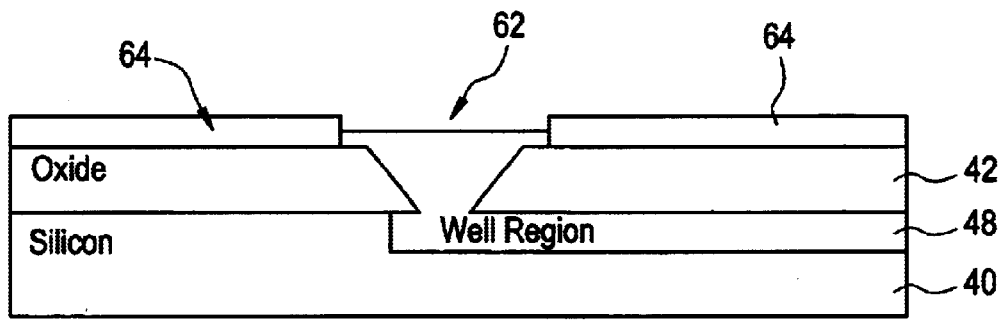

As shown in FIG. 2f, if desired, during the last portion of the silicon epitaxial growth a strained silicon region 62 is formed to enhance the mobility of the transistors. The silicon deposition can be made non-selective to deposit a polysilicon region 64 outside of the active region for contact, local interconnect or passive resistor formation.

Figure 2G:
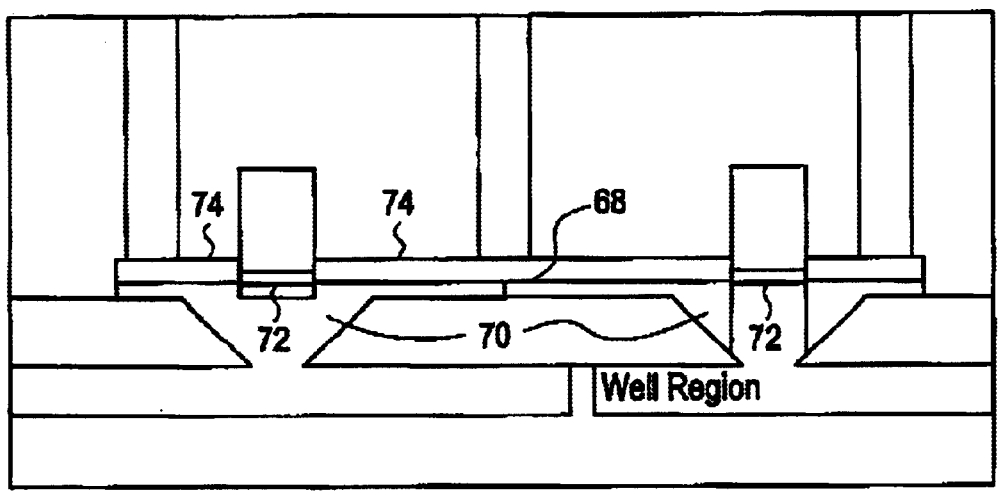

A final build out of the transistors formed in accordance with an embodiment of the present invention is shown in FIG. 2g. The final build out includes local interconnect 68 between transistor source and drain regions 70 shown for inverter circuit formation. Strained silicon channel regions 72 and silicided source and drain regions 74 are also provided.

As shown in FIG. 2g, the wafer provides an isolated active area. By using selective EPI to form the active areas in oxide trenches after the isolation areas have been defined, CMP can be eliminated from the process of active area isolation. The trench fill process has also been eliminated along with the processes of depositing and stripping the nitride layer. In addition, reverse tone masking, photoresist, and etching steps have also been eliminated.

In an alternative method of the present invention, the quality of the exposed silicon is improved by growing or depositing the initial oxide layer 42 thicker than the thickness desired for the isolation region. After the photo step an etch step is used to removed the oxide from the active area. This etch step is terminated before the entire oxide layer is removed. Thus, a thin protective oxide layer approximately 100–500 angstroms will be left covering the active area. The photo resist is then removed using a standard techniques. The thin protective oxide layer remaining over the active areas is removed either in a dip during the active area pre-clean or in-situ prior to the EPI deposition step. This will ensure a clean, pristine surface for both the silicon and the oxide for proper selective EPI growth. This EPI may also be doped with other impurities to improve device performance.

Although there will be a need to match the thicknesses of the oxide and the EPI, with the cleans, to ensure a high degree of planarization, the method of the present invention provides the advantages that it is cost efficient, fewer processing steps are required, finer line widths can be achieved for the isolation areas, and a lower defect density is accomplished in part due to the fact that Nitride or CMP slurry is not present.

By utilizing reverse trench isolation, the present invention provides a method for forming an active area in a wafer with smaller geometries. The method of the present invention is less expensive and less complicated than the current methods used for forming an active area in a wafer. The method of the present invention provides an active area in a wafer in which less power is consumed. The transistors formed on the wafer using the method of the present invention offer greater control. In addition, the interconnect coupling capacitance for passive devices or interconnect lines is reduced. Dummy island features or the use of a reverse tone masking layer to improve control of CMP STI oxide planarization are eliminated from the design.

While an embodiment of the present invention is shown and described, it is envisioned that those skilled in the art may devise various modifications of the present invention without departing from the spirit and scope of the appended claims.

What is claimed is:

1. A method for forming an active area on a substrate including the steps of:
   growing an isolation oxide layer on a silicon substrate;
   defining active areas on said substrate by providing a photoresist mask over said isolation oxide layer;
   performing an etching process to remove portions of said isolation oxide layer;
   performing a stripping process to remove said photoresist mask;
   removing residual oxide from said active areas;
   selectively growing epitaxial silicon; and
   doping said epitaxial silicon, wherein said step of doping said epitaxial silicon is carried out through a high angle well implant.

2. The method as defined in claim 1, further including the step of performing an implant process to form a well after growing said isolation oxide layer.

3. The method as defined in claim 1, wherein said etching process is a high pressure plasma etch.

4. The method as defined in claim 1, wherein said etching process is a wet etch.

5. The method as defined in claim 1, wherein said active areas on said substrate includes active areas which are oppositely doped and further including the steps of:
   defining oppositely doped active areas on said substrate by providing a photoresist mask over said isolation oxide layer;
   performing an etching process to remove portions of said isolation oxide layer relating to said oppositely doped active areas; and
   performing a stripping process to remove said photoresist mask used to define said oppositely doped active areas.

6. A The method as defined in claim 1, wherein said step of doping said epitaxial silicon is carried out through in situ techniques.

7. A The method as defined in claim 1, further including the step of depositing non-selective silicon.

8. A The method as defined in claim 7, wherein said step of depositing non-selective silicon includes a photolithography and etch process.

9. A method for forming an active area on a substrate including the steps of:

growing an isolation oxide layer on a silicon substrate;

defining active areas on said substrate by providing a photoresist mask over said isolation oxide layer;

performing an etching process to remove portions of said isolation oxide layer;

performing a stripping process to remove said photoresist mask;

removing residual oxide from said active areas;

selectively growing epitaxial silicon; and doping said epitaxial silicon, further including the step of depositing non-selective silicon.

10. The method as defined in claim 9, further including the step of performing an implant process to form a well after growing said isolation oxide layer.

11. The method as defined in claim 9, wherein said etching process is a high pressure plasma etch.

12. The method as defined in claim 9, wherein said etching process is a wet etch.

13. The method as defined in claim 9, wherein said active areas on said substrate includes active areas which are oppositely doped and further including the steps of:

defining oppositely doped active areas on said substrate by providing a photoresist mask over said isolation oxide layer;

performing an etching process to remove portions of said isolation oxide layer relating to said oppositely doped active areas; and performing a stripping process to remove said photoresist mask used to define said oppositely doped active areas.

14. The method as defined in claim 9, wherein said step of doping said epitaxial silicon is carried out through in situ techniques.

15. The method as defined in claim 9, wherein said step of depositing non-selective silicon includes a photolithography and etch process.

* * * * *